(12) United States Patent
Adlerstein et al.

(10) Patent No.: US 6,747,484 B1
(45) Date of Patent: Jun. 8, 2004

(54) RADIO FREQUENCY LIMITER CIRCUIT

(75) Inventors: Michael G. Adlerstein, Wellsley, MA (US); John C. Tremblay, Lancaster, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/420,454

(22) Filed: Apr. 22, 2003

(51) Int. Cl.$^7$ .............................. H01P 1/22; H01L 23/12
(52) U.S. Cl. ....................................... 327/17.2; 327/309
(58) Field of Search ................................. 327/312, 321, 327/309; 333/17.2, 104, 81 A

(56) References Cited

U.S. PATENT DOCUMENTS 5,878,334 A * 3/1999 Talisa et al. ............... 455/217
5,990,757 A * 11/1999 Tonomura et al. ......... 333/17.2

* cited by examiner

Primary Examiner—Dinh Thanh Le
(74) Attorney, Agent, or Firm—Daly, Crowley & Mofford, LLP

(57) ABSTRACT

A limiter circuit includes a rectification circuit coupled to an input of the limiter circuit. The rectification circuit produces a voltage having a predetermined average level. The level is a function of an input signal fed to the input of the limiter circuit. A voltage divider circuit is coupled to the rectification circuit for producing an output voltage having a level proportional to the input signal. An enhancement mode field effect transistor has a gate electrode fed by the output voltage produced by the voltage divider circuit. The transistor has drain and source electrodes coupled to an output of the limiter circuit and a reference potential, respectively. A transmission line is coupled between the input of the limiter and the output of the limiter circuit. The transmission line has an electrical length $n\lambda/4$, where $\lambda$ is the nominal operating wavelength of the limiter circuit and n is an odd integer. The use of an enhancement mode transistor with a positive gate threshold for conduction, greatly simplifies the limiter circuit compared with conventional designs using depletion mode transistors.

10 Claims, 2 Drawing Sheets

RADIO FREQUENCY LIMITER CIRCUIT

TECHNICAL FIELD

This invention relates to radio frequency limiter circuits, and more particularly to limiters used in r.f. amplifiers.

BACKGROUND

As is known in the art, radio frequency amplifiers are used in a wide range of applications. As is also known in the art, input stages of microwave, or mm-wave, solid state receiver amplifiers most often include a small, sensitive transistor designed to receive low level signals. Such an amplifier is sometimes referred to as a Low Noise Amplifier (LNA).

As is also known in the art, such transistor is subject to damage through exposure to high levels of input signals in the receive band of the transistor. To avoid this damage, a limiter circuit is introduced in front of the low noise input stage. Desirable properties of this circuit are (1) low loss in the non-limiting state (2) good match in the non-limiting state (3) high reflection when in the limiting state (4) fast response and recovery (5) immunity to burn out (6) compatibility with the technologies used in the solid state module or MMIC.

Conventional limiters use PIN diodes. However, such diodes are not generally compatible with many GaAs MMIC fabrication processes. Another limiter uses Schottky diodes. However, Schottky diode limiters must be large enough to handle the requisite power levels. Diodes can be used in conjunction with depletion mode high electron mobility transistors (depletion mode HEMTs); however, relatively complex bias circuits must be used for proper operation.

SUMMARY

In accordance with the invention, a limiter circuit includes a rectification circuit coupled to an input of the limiter circuit. The rectification circuit produces a voltage having a predetermined average level. The level is a function of an input signal fed to the input of the limiter circuit. A voltage divider circuit is coupled to the rectification circuit for producing an output voltage having a level proportional to the input signal. An enhancement mode field effect transistor has a gate electrode fed by the output voltage produced by the voltage divider circuit. The transistor has drain and source electrodes coupled to an output of the limiter circuit and a reference potential, respectively. A transmission line is coupled between the input of the limiter and the output of the limiter circuit. The transmission line has an electrical length $n\lambda/4$, where k is the nominal operating wavelength of the limiter circuit and n is an odd integer.

In one embodiment, the rectification circuit includes a pair of unidirectional conducting devices and a pair of capacitors. A first one of the capacitors is connected between the input of the limiter circuit and a junction. One of the unidirectional conducting devices is connected between the junction and the reference potential. The other one of the pair of unidirectional devices is connected between the junction and an input to the voltage divider circuit at a second junction. The other one of the capacitors is connected between the input of the voltage divider and the predetermined reference potential.

In one embodiment, the unidirectional devices are diodes.

In one embodiment, the unidirectional devices are diode-connected transistors.

In accordance with another feature of the invention, the rectification circuit is a voltage multiplier circuit.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
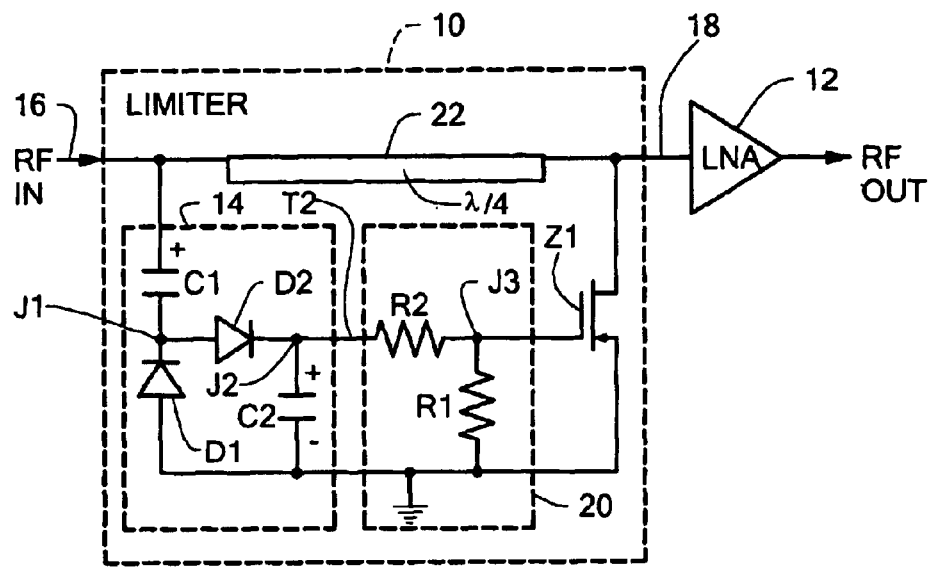
FIG. 1 is a schematic diagram of a limiter circuit coupled to a Low Noise Amplifier according to the invention.

Referring now to FIG. 1, a limiter circuit 10 is shown for limiting a voltage at an input to an amplifier 12, here a Low Noise Amplifier. The limiter circuit 12 includes a voltage multiplier circuit 14, here a voltage doubler circuit. More particularly, the voltage multiplier circuit is here a rectification circuit coupled to an input of the limiter circuit. The rectification circuit 14 produces a voltage having a predetermined average level which is a function of an input signal fed to the input of the limiter circuit 10. The rectification circuit 14 includes a plurality of unidirectional conducting devices, here a pair of diodes D1 and D2 and a pair of capacitors C1 and C2. Capacitor C1 is connected between the input 16 of the limiter circuit 10 and a junction J1. More particularly, the anode of diode D1 is connected to ground and the cathode thereof is connected to the junction J1. The anode of diode D2 is connected to the junction J1 and the cathode thereof is connected to junction J2, as shown.

Diode D1 is connected between the junction J1 and reference potential, here ground. Diode D2 is connected between the junction J1 and an input to a voltage divider circuit 20 at a second junction J2. Capacitor C2 is connected between the input J2 of the voltage divider circuit 20 and the predetermined reference potential.

The voltage divider circuit 20 is coupled to the rectification circuit 14 for producing an output voltage having a level proportional to the input signal at input 16. The output of the voltage divider 20, i.e., junction J3, is coupled to the gate electrode of an enhancement mode pHEMT, Z1.

Thus, the branch consisting of the capacitor C1 and the diode D1 rectify the input signal at input 16 such that the cathode of the diode switches between ground potential when conducting and some positive value when not conducting. The diode D1 is forward biased when radio frequency (r.f.) input signal at input 16 is negative in polarity relative to ground. In steady state, the capacitor C1 charges to the potential $-V_0$ relative to ground where the r.f. input voltage is given by $V_0 \sin(\omega t)$. The peak voltage across the diode occurs when the potential on the r.f. line is $V_0$. Thus the peak voltage across the diode, Vp=(voltage level at the input 16-(the change in potential across the capacitor)=$V_0-(-V0)=2V_0$. The capacitor C2 therefore charges to $2V_0$ through the diode D2. A portion of this voltage at the junction J2 (i.e., at the output of the voltage doubler) appears at the gate of an enhancement mode pHEMT Z1. If the voltage is sufficient, the transistor Z1 will turn on and conduct. This shorts the r.f. line at the input to the Low Noise Amplifier (LNA) 12 to ground.

More particularly, the resistor R2 and R1 are present to set the threshold voltage of the limiter 10 and to allow for discharge of the capacitors C1 and C2 upon the cessation of r.f. input voltage at input 16. The resistor R1 insures that the gate of the enhancement mode pHEMT (EpHEMT) is held near zero bias in the absence of a large level of input signal at input 16. Under this condition, the EpHEMT is not conducting and the circuit will not limit power to the LNA.

A transmission line 22 is coupled between the input 16 of the limiter 10 and the input of the LNA, i.e., at the output 18 of the limiter 10. The transmission line 22 has an electrical length $n\lambda/4$, where $\lambda$ is the nominal operating wavelength of the amplifier and n is an odd integer. Thus, when the input voltage at the input 16 is excessive resulting in transistor Z1 being biased to its conducting state, the short circuit at the output 18 of the limiter 10 appears as an open circuit (i.e., high impedance) at the input 16 of the limiter 10; in the absence of the excessive voltage, transistor Z1 is biased off and the input signal passes through the limiter to the input of the LNA.

Figure 2:
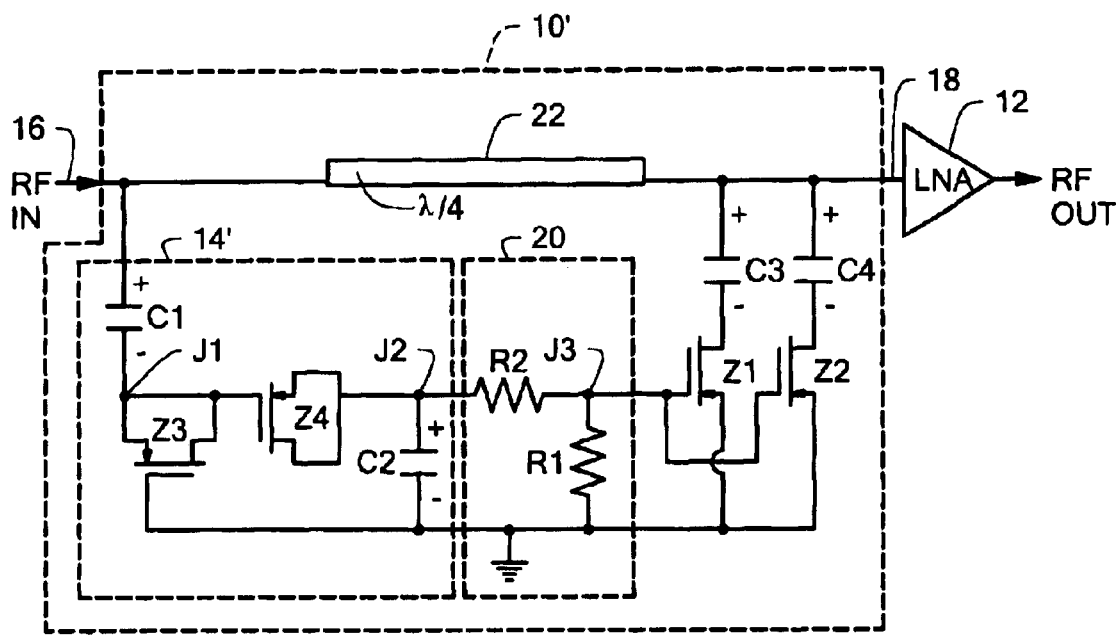
FIG. 2 is a schematic diagram of a limiter circuit coupled to a Low Noise Amplifier according to another embodiment of the invention.

Referring now to FIG. 2, another embodiment of a limiter circuit 10' is shown. Here, diode D1 is replaced with a diode connected transistor Z3 and diode D2 is replaced with a diode connected transistor Z4. Thus, transistor Z3 has the source and drain electrodes thereof connected to junction J1 and a gate electrode connected to ground. Transistor Z4 has a gate electrode connected to the junction J1, the source and drain electrodes thereof connected to the junction J2.

Here, in the limiter circuit 10' there are an additional pair of capacitors C3 and C4. Further, instead of using only a single transistor Z1 as in limiter 10, here there is a pair of EpHEMT transistors Z1 and Z2. Both transistors Z1 and Z2 have the gate electrodes fed by the output voltage produced by the voltage divider circuit 20 (i.e., the voltage at junction J3). The transistors Z1 and Z2 have their drain electrodes coupled to the input of the LNA 12 though a corresponding one of the pair of capacitors C3 and C4, as indicated. The source electrodes of the transistors Z1 and Z2 are coupled to ground. With such an arrangement the transistors Z1 and Z2 need handle only half the power required when the limiter responds to an excessive input voltage at input 16.

It is noted that with the limiter 10 and the limiter 10', the transmission line 22 being an odd multiple quarter-wave length has the effect of having a reflection at the input 16 and a reflection at the output 18 cancel one another even in the non-limiting state.

The advantage of using an enhancement transistor for the transistors Z1 and Z2 is that such a transistor is off (non-conducting) at zero bias and turns on when a positive voltage is applied. This results in a much simpler bias circuit compared to the case when a conventional depletion mode transistor is used to clamp the r.f. line.

The action of the limiters 10, 10' are enhanced by the addition of the $\lambda/4$ transmission line. As the transistors Z1 and Z2 conduct, the short circuit at the input to the LNA increases the input impedance at the input to the limiter 10, 10'; from, here a 50 ohm impedance, to up to a high value. This results in increasing voltage amplitude across the diode D1, or diode connected transistor Z3 creating positive feedback for the limiting action.

The quarter wave transmission line can be used to advantage to improve the match of the limiter in the off state by using the circuit configuration 10' shown in FIG. 2. Here the diode connected transistors Z3 and Z4 are formed using the gates of EpHEMT's. The sizing of clamping transistors Z1 and Z2 and the drain, or coupling capacitors C3 and C4 are chosen to present the same shunt impedance as does the rectification circuit 14'. Therefore over a narrow operating bandwidth, the reflection due to the rectification circuit 14' cancels the reflection due to the clamp branch (i.e., transistors Z1, Z2 and capacitors C3 and C4). The limiter 10' size can be minimized by using a synthetic transmission line 22 having inductors and capacitors.

Figure 3:
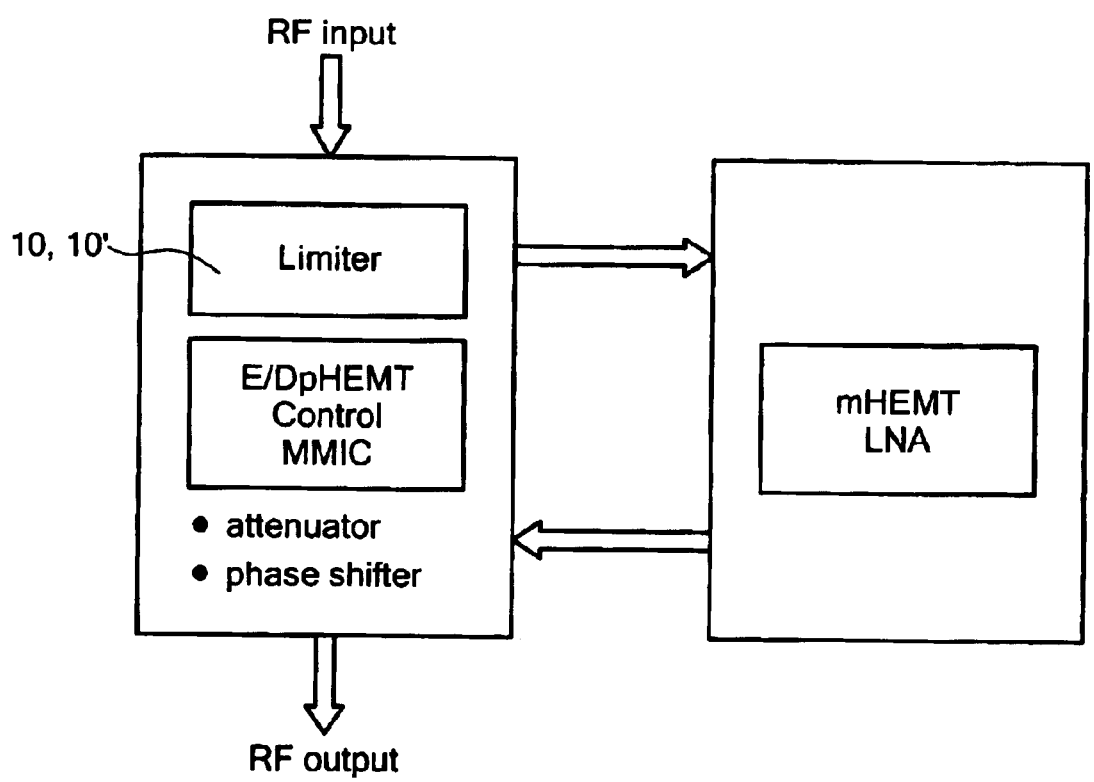
FIG. 3 is a diagram showing use of the limiter circuits of FIGS. 1 or 2 in a phased array element.

It was noted that the preferred implementation of the limiter 10, 10' uses enhancement mode pHEMTs. These EpHEMTs typically have higher breakdown voltages compared with transistor types often used in low noise amplifiers such as metamorphic High Electron Mobility Transistors (mHEMT's). These EpHEMTs therefore have greater power handling capability. In many systems, EpHEMTs are available on chips working in conjunction with the low noise amplifiers. Such a configuration is shown in FIG. 3 for a phased array element. In such application, the input signal is introduced onto the EpHEMT chip which would contain the limiter 10, 10'. The output of the limiter 10, 10' would then be fed to a low noise amplifier MMIC optimized for low noise figure and gain. In systems where EmHEMT's are used, the limiter 10, 10' described would be incorporated directly into the LNA MMIC.

A number of embodiments of the invention have been described. Neverthe-less, it will be understood that various modifications may be made without departing from the spirit and scope of the invention. Accordingly, other embodiments are within the scope of the following claims.

What is claimed is:

1. A limiter circuit, comprising:
   a rectification circuit coupled to an input of the limiter circuit, such rectification circuit producing a voltage having a predetermined average level, such level being a function of an input signal fed to the input of the limiter circuit;
   a voltage divider circuit coupled to the rectification circuit for producing an output voltage having a level proportional to the input signal;
   an enhancement mode field effect transistor having a gate electrode fed by the output voltage produced by the voltage divider circuit, such transistor having drain and source electrodes, one of such source and drain electrodes being coupled to an output of the limiter circuit and the other one of the source and drain electrodes being coupled to a reference potential; and
   a transmission line coupled between the input of the limiter and the output of the limiter circuit, such transmission line having an electrical length $n\lambda/4$, where $\lambda$ is the nominal operating wavelength of the limiter circuit and n is an odd integer.

2. The limiter circuit recited in claim 1 wherein the rectification circuit comprises:
   a pair of unidirectional conducting devices; and
   a pair of capacitors; and
   wherein a first one of the capacitors is connected between the input of the limiter circuit and a junction;
   wherein one of the unidirectional conducting devices is connected between the junction and the reference potential;
   wherein the other one of the pair of unidirectional devices is connected between the junction and an input to the voltage divider circuit at a second junction;
   wherein the other one of the capacitors is connected between the input of the voltage divider and a predetermined reference potential.

3. The limiter circuit recited in claim 2 wherein the unidirectional devices are diodes.

4. The limiter circuit recited in claim 2 wherein the unidirectional devices are diode-connected transistors.

5. The limiter circuit recited in claim 2 wherein the voltage divider network includes a pair of resistors, one of such resistors being connected between second junction and the gate electrode of the transistor and the predetermined reference potential.

6. The limiter circuit recited in claim 5 wherein the unidirectional devices are diodes.

7. The limiter circuit recited in claim 5 wherein the unidirectional devices are diode-connected transistors.

8. A limiter circuit, comprising:
   a voltage divider circuit;
   a rectification circuit coupled to an input of the limiter circuit, such rectification circuit producing a voltage having a predetermined average level, such level being a function of an input signal fed to the input of the limiter circuit, such rectification circuit comprising:
     a plurality of unidirectional conducting devices; and
     a pair of capacitors; and
     wherein a first one of the capacitors is connected between the input of the limiter circuit and a junction;
     wherein one of the unidirectional conducting devices is connected between the junction and a reference potential;
     wherein another one of the unidirectional devices is connected between the junction and a second junction;
   wherein the other one of the capacitors is connected between the input of the voltage divider circuit and a predetermined reference potential,
   a voltage divider circuit coupled to the rectification circuit for producing an output voltage having a level proportional to the input signal;
   a plurality of coupling capacitors;
   a plurality of enhancement mode field effect transistors having gate electrodes fed by the output voltage produced by the voltage divider circuit, such transistors having a drain electrode and a source electrode, one of such source and drain electrodes of the plurality of transistors being coupled to an output of the limiter circuit through a corresponding one of the plurality of coupling capacitors and the other one of the source and drain electrodes of the plurality of transistors being coupled to a reference potential; and
   a transmission line coupled between the input of the limiter and the output of the limiter circuit, such transmission line having an electrical length $n\lambda/4$, where $\lambda$ is the nominal operating wavelength of the limiter circuit and n is an odd integer.

9. The limiter circuit recited in claim 8 wherein the unidirectional devices are transistors, one of the transistors having source and drain electrode connected to the first-mentioned junction and a gate electrode connected to the predetermined reference potential and the other one of the transistors having a gate electrode connected to the first-mentioned junction and the source and drain electrodes thereof connected to the second junction.

10. A limiter circuit, comprising:
    a voltage multiplier circuit coupled to an input of the limiter circuit, such voltage multiplier circuit producing a voltage having a predetermined average level, such level being a function of an input signal level fed to the input of the limiter circuit;
    a voltage divider circuit coupled to the rectification circuit for producing an output voltage having a level proportional to the input signal;
    an enhancement mode field effect transistor having a gate electrode fed by the output voltage produced by the voltage divider circuit, such transistor having drain and source electrodes, one of such source and drain electrodes being coupled to an output of the limiter circuit and the other one of the source and drain electrodes being coupled to a reference potential; and
    a transmission line coupled between the input of the limiter and the output of the limiter circuit, such transmission line having an electrical length $n\lambda/4$, where $\lambda$ is the nominal operating wavelength of the limiter circuit and n is an odd integer.

* * * * *

UNITED STATES PATENT AND TRADEMARK OFFICE
CERTIFICATE OF CORRECTION

PATENT NO. : 6,747,484 B1  Page 1 of 1
APPLICATION NO. : 10/420454
DATED : June 8, 2004
INVENTOR(S) : Adlerstein et al.

It is certified that error appears in the above-identified patent and that said Letters Patent is hereby corrected as shown below:

Col. 1, line 49, delete "K" and replace with --$\lambda$--.

Col. 3, line 1, delete "resistor $R_2$ and $R_1$" and replace with --resistors $R_2$ and $R_1$--.

Col. 3, line 36, delete "though" and replace with --through--.

Col. 3, line 39, delete "arrangement the" and replace with --arrangement, the--.

Col. 3, line 57-58, delete "limiter 10, 10';" and replace with --limiters 10, 10';--.

Col. 4, line 9, delete "limiter 10, 10'" and replace with --limiters 10, 10'--.

Col. 4, line 19, delete "limiter 10, 10'." and replace with --limiters 10, 10'.--.

Col. 4, line 19, delete "limiter 10, 10'" and replace with --limiters 10, 10'--.

Col. 4, line 21, delete "EmHEMT's" and replace with --EpHEMTs--.

Col. 4, line 22, delete "limiter 10, 10'" and replace with --limiters 10, 10'--.

Col. 4, line 25, delete "Neverthe-less," and replace with --Never the less,--.

Col. 5, line 7, delete "between second" and replace with --between the second--.

Col. 6, line 14, delete "electrode" and replace with --electrodes--.

Signed and Sealed this

Tenth Day of February, 2009

JOHN DOLL
*Acting Director of the United States Patent and Trademark Office*